SINGLE RESONANCE PHOTODIODE PARAMETRIC AMPLIFIER CONVERTER

Filed April 21, 1965

United States Patent Office 3,280,336

Patented Oct. 18, 1966

3,280,336
SINGLE RESONANCE PHOTODIODE PARAMETRIC AMPLIFIER CONVERTER

David J. Roulston, Paris, France, assignor to CFS-Compagnie Generale de Telegraphie Sans Fil, a corporation of France Filed Apr. 21, 1965, Ser. No. 449,702
Claims priority, application France, Apr. 24, 1964, 972,171
2 Claims. (Cl. 307—88.3)

The present invention relates to variable capacitance diode amplifiers.

It is an object of the invention to provide a diode parametric amplifier wherein the noise is particularly low.

According to the invention there is provided a parametric amplifier comprising a variable capacitance diode having a capacitance $Cd$, means for applying an input signal having a frequency $f_1$ and means for applying a pumping signal having a frequency $f_p$ to this diode, a coupling capacitor, an inductance and a load resistance $R_c$ connected in series with the variable capacitance diode, wherein the inductance is tuned with the capacitance $Cd$ and the coupling capacitor in series to a frequency $f_2=f_p\pm f_1$.

For a better understanding of the invention and to show how the same may be carried into effect, reference will be made to the drawing accompanying the following description and wherein.

The same reference numbers designate the same elements throughout all the figures.

Figure 1:
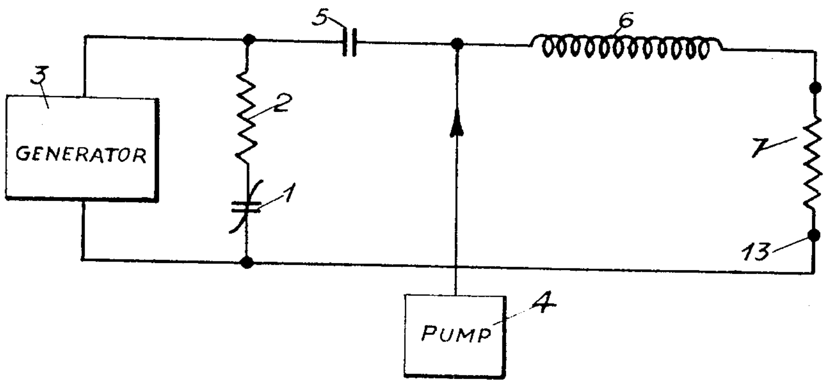
FIG. 1 shows the circuit arrangement of a parametric amplifier according to the invention.

In FIG. 1 a parametric diode is shown as a variable capacitor 1, having a given capacitance $Cd$ for a given reverse bias voltage and a resistor 2 in series with capacitor 1. Diode 1–2 receives a signal of frequency $f_1$ supplied by a generator 3, with for example, a practically infinite output impedance. Diode 1–2 also receives energy at a frequency $f_p$, much higher than $f_1$, from a pumping source 4. In the arrangement according to the invention this pumping circuit has to be loosely coupled to the main circuit to prevent its introducing appreciable losses. A capacitor 5 provided coupling between diode 1–2 and an output circuit 6–7.

In practice, capacitor 5 will be preferably selected to have a capacity C comprised between 0.5 $Cd$ and 2 $Cd$, although this is not restrictive.

The output circuit includes a tuning inductance 6 and a load 7 shown schematically as a resistance of value $R_c$, coupled between output terminals 13.

According to one essential characteristics of the invention, inductance 6 is tuned with the two capacitors 1 and 5 in series to a frequency $f_2=f_p\pm f_1$. Further, load 7 is selected so that the effective input resistance is very nearly equal to the diode reactance at frequency $f_1$, i.e. such that the following relation is approximately satisfied:

$$R_C\cong 1/(32\pi f_p Cd)$$

when the resistance 2 is negligible with respect to the reactance of the diode at frequency $f_p$.

When the above conditions are satisfied, the arrangement just described behaves substantially as a conventional parametric diode system, including a second inductance tuned to the input frequency $f_1$, but it has the following advantages over the conventional system.

(a) The absence of a tuning inductance for the tuning at the input frequency ensures the suppression of an important source of noise. The pass-band is no longer limited by the input circuit, as is the case in conventional circuits. It is entirely determined by the parameters of the circuits tuned to the output frequency.

So the input signal bandwidth may be substantially more than one octave wide.

Further, noise due to the following amplifier (shown by resistance $R_c$ 7, at a noise temperature $T_c$3, which is the main cause of noise in the best case, is very low due to the fact that, since the output frequency is much higher than the input frequency the circuit gain is high.

(b) The diode capacitance $Cd$ which should be selected as low as possible, in series with another capacitor C of the same order of magnitude, is no longer tuned to the input frequency but to the output frequency. The input impedance seen by generator 3, hence the power supplied at the input frequency, is high (parametric amplification theory shows that the input resistance is proportional to the reactance of the diode).

Figure 2:
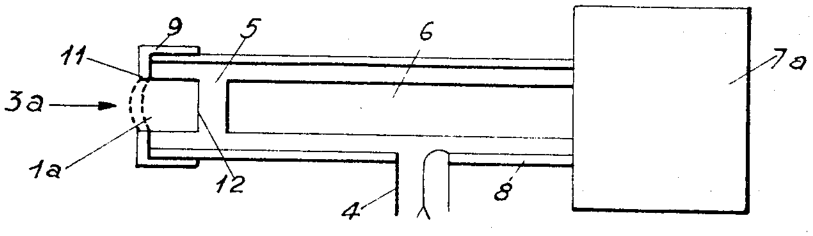
FIG. 2 shows a circuit according to the invention, using coaxial line techniques for the reception of amplitude modulated optical signals, and in which a single diode is used for photon detection and for the parametric amplification.
Figure 3:
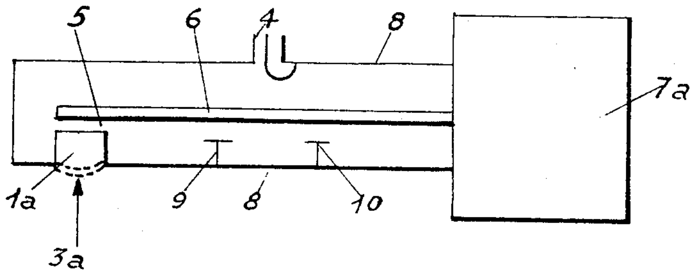
FIG. 3 is a modification of the arrangement of FIG. 2.

The circuits of FIGS. 2 and 3 show a particularly valuable application of the invention.

It is well known that the same diode can be used for the reception of an optical signal, modulated in amplitude at frequency $f_1$, and for the parametric amplification of the detected signal. The arrangements generally used for this purpose include a pump, which applies to the diode power at a frequency $f_p$, higher than $f_1$, a first circuit tuned to the input frequency $f_1$, a second circuit tuned to frequency $f_p\pm f_1$, the output being either at $f_1$ or $f_p-f_1$ (negative resistance amplifier) or to $f_p+f_1$ ("up-converter").

The small dimensions of such arrangements and their ruggedness are appreciable advantages as compared to photo-multipliers; unfortunately the circuits generally associated with them considerably reduce their sensitivity. In the case of a conventional negative resistance parametric amplifier, gain can be high but the pass-band is necessarily narrow. In the case of a conventional up-converter parametric amplifier with a wide band and high gain, using a photoparametric diode, losses in the circuit tuned to the input frequency are large. Also, this circuit limits the input impedance and consequently the power supplied at the input at the frequency $f_1$ as well as the pass-band.

One of the essential objects of the present invention is in fact to remove these drawbacks.

In FIGS. 2 and 3 reference number 1$a$ designates the photoparametric diode. Generator 3 of FIG. 1 is in these figures replaced by the optical signal 3$a$, applied to diode 1$a$. The optical signal 3$a$ is amplitude modulated at a frequency $f_1\pm\Delta f/2$.

In FIG. 2, inductance 6 consists of the central conductor of a coaxial line. The outer conductor 8 of this line is electrically connected to the casing 11 of the diode, which forms one of the diode terminals, by a connection 9. The capacitance 5 is that which exists between the other diode terminal 12 and central conductor 6. The pumping circuit 4 consists of a coaxial line section connected to the outer conductor of line 8.

The reference 7$a$ corresponds to the load coupled by a variable coupling cavity. This cavity forms a filter which filters the circuit at the output frequency$=f_p\pm(f_1\pm\Delta f/2)$.

The modification of FIG. 3 is similar to that of FIG. 2 except that a triplate line is used. The triplate line comprises a central strip 6 and outer plates 8 and includes adjusting screws 9 and 10.

The following values are given as examples, and are understood to be nonrestrictive.

| | | | |
|---|---|---|---|
| $f_1$ | Input frequency (mc./s.) | 30±15 | 1±0.5 |
| $f_p$ | Pump frequency (gc./s.) | 3 | 1 |
| $Cd_1$ | Diode capacitance (*pF*) | 0.5 | 0.5 |
| C (5) | Coupling capacitance (*pF*) | 0.3 | 0.3 |
| $R_c$ (7) | Load resistance (ohms) approximately. | 6 | 20 |
| $T_c$ | Noise temperature (°K). of $R_c$ | 300 | 100 |
| $f_c$ | Minimum diode cutoff frequency (gc./s.). | 150 | 50 |
| F | Figure of merit | $0.6\times 10^{2}$² | $3\times 10^{2}$² |

In this case, we define the figure of merit thus:

$$F=\frac{\text{sensitivity of an ideal quantum detector}}{\text{sensitivity of a detector conforming to the invention.}}$$

Sensitivity is defined as the minimum power received for a signal-to-noise ratio equal to 1 in the load $R_c$.

For comparison purposes, the factor F would be about $1\times 10^{-2}$ for a photomultiplier with a quantum efficiency of 1%. (It is assumed, as is generally the case, that the quantum efficieny of the photodiode is about 1). The system according to the invention may thus provide a higher value.

Of course, the invention is not limited to the embodiments described and shown, which were given solely by way of example. Thus, generator 3 may have a finite impedance and a low noise temperature.

What is claimed is:

1. A parametric amplifier comprising: a variable capacitance photodiode having a capacitance *Cd* and two terminals; means for applying a signal having a frequency $f_1$ to said photodiode; a coaxial line, with an outer conductor and a central conductor, and output terminals in series with said photodiode, one of said terminals of said photodiode being connected with said outer conductor and the other of said terminals of said photodiode being coupled with said central conductor by a coupling capacitance, the inductance of said central conductor being tuned with said capacitance *Cd* and said coupling capacitance to a frequency $f_2=f_p\pm f_1$, said frequency $f_p$ being much higher than said frequency $f_1$ and said coupling capacitance being between 0.5 and 2 times said capacitance *Cd*; a load resistance *Rc* connected between said output terminals, said resistance $R_c$ being approximately defined by the following relation:

$$R_c\cong 1/(32\pi f_p C_d)$$

2. A parametric amplifier comprising: a variable capacitance photodiode having a capacitance *Cd* and two terminals; means for applying a signal having a frequency $f_1$ to said photodiode; means for applying a pumping signal having a frequency $f_p$ to said photodiode; a triplate line, with outer plates and a central strip, and output terminals in series with said photodiode, one of said terminals of said photodiode being connected with said outer plates and the other of said terminals of said photodiode being coupled with said central strip by a coupling capacitance, the inductance of said central strip being tuned with said capacitance *Cd* and said coupling capacitance to a frequency $f_2=f_p\pm f_1$, said frequency $f_p$ being much higher than said frequency $f_1$ and said coupling capacitance being between 0.5 and 2 times said capacitance *Cd*; a load resistance $R_c$ connected between said output terminals, said resistance $R_c$ being approximately defined by the following relation: $R_c\cong 1/32\pi f_p Cd$.

References Cited by the Examiner

UNITED STATES PATENTS 3,132,258 5/1964 Gaertner et al. ______ 330—4.9

OTHER REFERENCES

Fisher, "Proc. IRE," July 1960, pp. 1227–1232.

ROY LAKE, *Primary Examiner.*

D. HOSTETTER, *Assistant Examiner.*